(12) United States Patent
Kim et al.

(10) Patent No.: US 11,283,053 B2
(45) Date of Patent: Mar. 22, 2022

(54) DISPLAY PANEL

(71) Applicant: LG Display Co., Ltd., Seoul (KR)

(72) Inventors: JaeHyun Kim, Gyeonggi-do (KR); DeukHo Yeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 147 days.

(21) Appl. No.: 16/535,860

(22) Filed: Aug. 8, 2019

(65) Prior Publication Data

US 2020/0194728 A1 Jun. 18, 2020

(30) Foreign Application Priority Data

Dec. 12, 2018 (KR) .......... 10-2018-0160267

(51) Int. Cl.
| | |
|---|---|
| *H01L 51/00* | (2006.01) |
| *H01L 51/52* | (2006.01) |
| *H01L 27/32* | (2006.01) |
| *H01L 51/50* | (2006.01) |
| *G02B 1/118* | (2015.01) |
| *G06F 3/044* | (2006.01) |

(52) U.S. Cl.
CPC .......... *H01L 51/5281* (2013.01); *G02B 1/118* (2013.01); *G06F 3/044* (2013.01); *H01L 27/322* (2013.01); *H01L 27/323* (2013.01); *H01L 27/3244* (2013.01); *H01L 51/5072* (2013.01); *H01L 51/5253* (2013.01); *H01L 2251/533* (2013.01); *H01L 2251/5315* (2013.01)

(58) Field of Classification Search
CPC .... H01L 51/5281; H01L 27/322; G02B 1/118
See application file for complete search history.

(56) References Cited

U.S. PATENT DOCUMENTS

| | | | |
|---|---|---|---|
| 2011/0122053 A1* | 5/2011 | Jeong | H01L 51/5275 345/76 |
| 2013/0285539 A1* | 10/2013 | Kim | H01L 51/5281 313/504 |
| 2019/0115395 A1* | 4/2019 | Lee | G06F 3/0412 |

* cited by examiner

*Primary Examiner* — Samuel A Gebremariam
(74) *Attorney, Agent, or Firm* — Seed IP Law Group LLP

(57) ABSTRACT

A display panel has a nanoscaled moth-eye pattern that is patterned and disposed on at least one layer disposed on a path along which light emitted from light-emitting diodes emerges, such that transmittance of light emerging outward from the display panel can be increased while reducing reflectance of external light. Further, an anti-reflector is disposed on an area other than a light-emitting area, and the moth-eye pattern is disposed on open areas of the anti-reflector. Thereby, it is possible to suppress reflected light and prevent reflection of external light on an area on which the anti-reflector cannot be disposed.

19 Claims, 13 Drawing Sheets

FIG.6
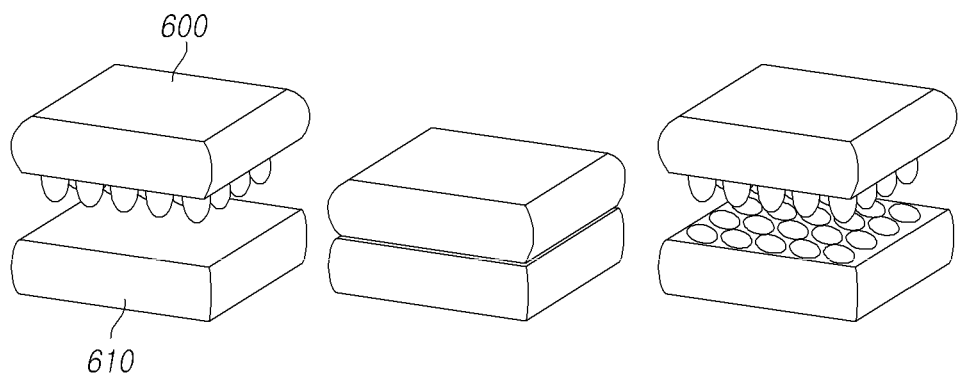
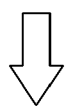
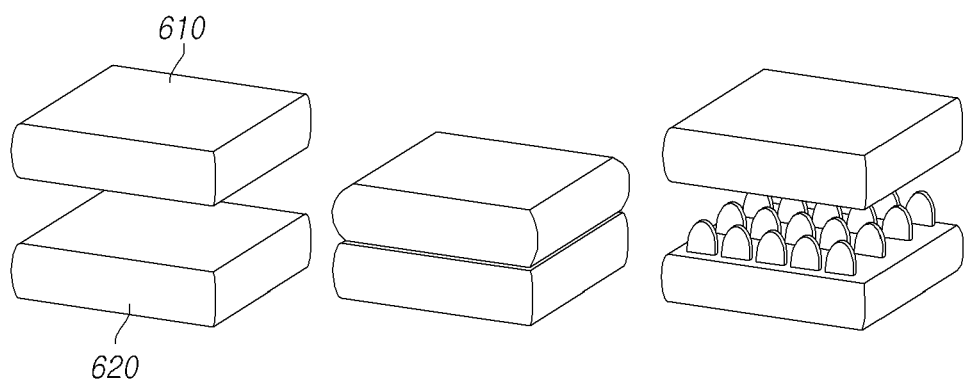

DISPLAY PANEL

CROSS REFERENCE TO RELATED APPLICATION

This application claims priority to Korean Patent Application No. 10-2018-0160267, filed on Dec. 12, 2018, which is hereby incorporated by reference for all purposes as if fully set forth herein.

BACKGROUND

Technical Field

Exemplary embodiments relate to a display panel.

Description of Related Art

With the development of the information society, demand for a variety of types of display devices for displaying images is increasing. In this regard, display devices, such as liquid crystal display (LCD) devices, and organic light-emitting diode (OLED) display devices, have come into widespread use.

Such display devices include a display panel in which a plurality of subpixels and a plurality of signal lines and voltage lines are disposed. The display device displays images by controlling the luminous intensities represented by the plurality of subpixels arrayed in the display panel.

In this case, external light incident upon the display panel can be reflected on a surface through which the display panel displays images. Due to this reflection of external light, there is a problem that the images displayed by the display panel may not be readily perceived.

BRIEF SUMMARY

Various aspects of the present disclosure provide a display panel capable of reducing reflectance of external light incident upon the display panel without disposing a polarizer on a surface through which the display panel displays images.

Various aspects of the present disclosure provide a display panel capable of reducing reflectance of external light incident upon the display panel and increasing transmittance of light emerging from the display panel.

According to an aspect, exemplary embodiments may provide a display panel including: a substrate; at least one lower insulation layer disposed on the substrate; a plurality of light-emitting diodes disposed on the at least one lower insulation layer; and at least one upper insulation layer disposed on the plurality of light-emitting diodes. In the display panel, at least one of the at least one lower insulation layer and the at least one upper insulation layer, which is located on a path along which light emitted from the light-emitting diodes emerges, includes a nanoscaled moth-eye patterned layer patterned on at least a portion of one surface thereof.

According to another aspect, exemplary embodiments may provide a display panel including: a substrate; a plurality of light-emitting diodes disposed on the substrate; at least one insulation layer disposed on the plurality of light-emitting diodes; an anti-reflector disposed on at least a portion of an area other than areas corresponding to areas on which the light-emitting diodes are disposed on the at least one insulation layer; and an anti-reflection layer disposed on open areas of the anti-reflector and including a nanoscaled moth-eye patterned layer.

According to another aspect, exemplary embodiments may provide a display panel including: a transparent substrate; at least one first lower insulation layer disposed on the substrate; a plurality of thin film transistors disposed on the at least one first lower insulation layer; at least one second lower insulation layer disposed on the plurality of thin film transistors; and a plurality of light-emitting diodes disposed on the at least one second lower insulation layer. At least one of the transparent substrate, the at least one first lower insulation layer, and the at least one second lower insulation layer includes a nanoscaled moth-eye patterned layer patterned on at least a portion of one surface thereof.

According to exemplary embodiments, a nanoscaled moth-eye patterned layer is patterned and disposed on one surface of at least one insulation layer disposed on a path along which light emitted from light-emitting diodes on a display panel emerges, such that transmittance of light emerging from the display panel can be increased while reducing reflectance of external light.

Further, an anti-reflector is disposed on at least a portion of an area other than areas corresponding to the light-emitting diodes on a surface through which an image is displayed on the display panel, such that the reflectance of external light can be further reduced.

In addition, the moth-eye patterned layer is disposed on open areas of the anti-reflector, such that the reflectance of external light can be reduced without a polarizer, even in the case of a display panel having a high aperture ratio.

BRIEF DESCRIPTION OF THE SEVERAL VIEWS OF THE DRAWINGS

The above and other features and advantages of the present disclosure will be more clearly understood from the following detailed description when taken in conjunction with the accompanying drawings, in which:

FIGS. 5 and 6 illustrate a method of disposing the moth-eye patterned layer in the display panel according to exemplary embodiments;

DETAILED DESCRIPTION

Figure 1:
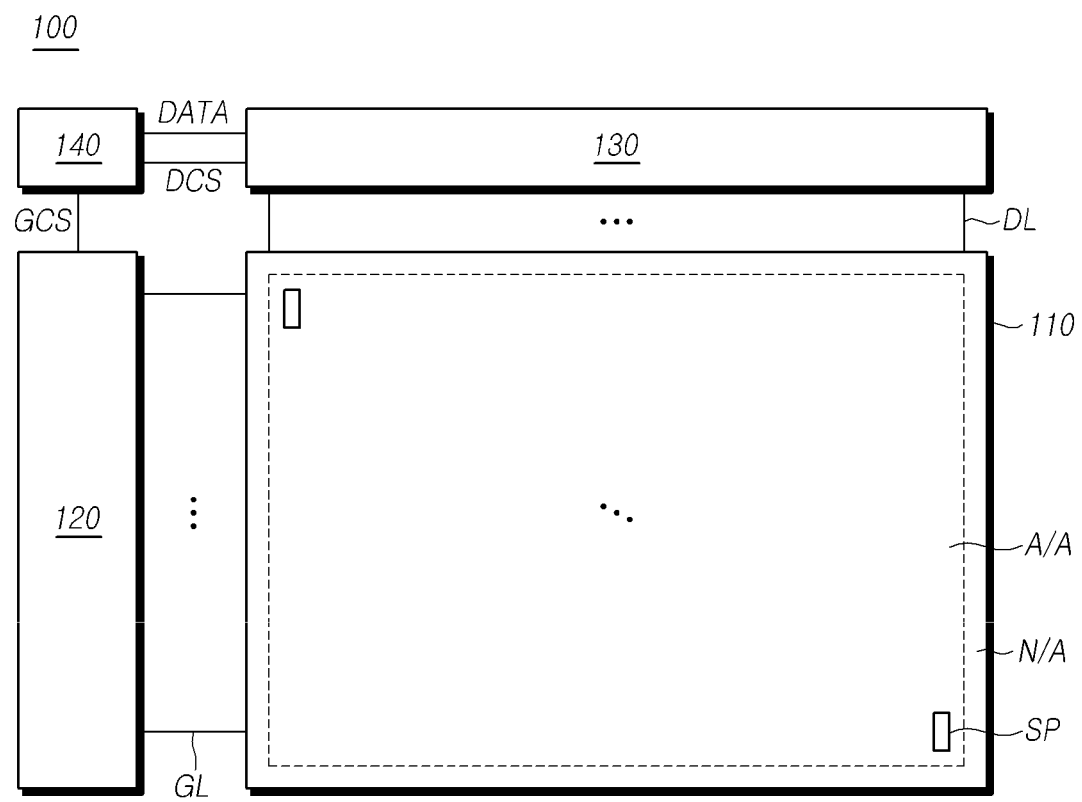
FIG. 1 illustrates a schematic configuration of a display device according to exemplary embodiments of the present disclosure.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on" or "under" another element, not only can it be directly located on or under the other element, but it can also be indirectly located on or under the other element via an intervening element.

FIG. 1 illustrates a schematic configuration of a display device 100 according to exemplary embodiments of the present disclosure.

Referring to FIG. 1, the display device 100 according to exemplary embodiments may include a display panel 110 having an active area A/A and a non-active area N/A, as well as components for driving the display panel 110, such as a gate driver circuit 120, a data driver circuit 130, and a controller 140.

In the display panel 110, a plurality of gate lines GL and a plurality of data lines DL are disposed, and a plurality of subpixels SP are disposed in areas in which the plurality of gate lines GL intersect the plurality of data lines DL.

The gate driver circuit 120 is controlled by the controller 140 to sequentially output a scanning signal to the plurality of gate lines GL disposed in the display panel 110, thereby controlling points in time at which the plurality of subpixels SP are driven.

The gate driver circuit 120 may include one or more gate driver integrated circuits (GDICs). The gate driver circuit 120 may be disposed on one side or both sides of the display panel 110, depending on the driving system.

Each of the GDICs may be connected to a bonding pad of the display panel 110 by a tape-automated bonding (TAB) method or a chip-on-glass (COG) method, may be implemented using a gate-in-panel (GIP) structure directly disposed in the display panel 110, or in some cases, may be integrated with the display panel 110. Alternatively, each of the GDICs may be implemented using a chip-on-film (COF) structure mounted on a film connected to the display panel 110.

The data driver circuit 130 receives image data from the controller 140, and converts the image data into an analog data voltage. In addition, the data driver circuit 130 outputs the data voltage to the data lines DL, respectively, at points in time at which the scanning signal is applied through the gate lines GL, so that the subpixels SP represent luminous intensities corresponding to the image data.

The data driver circuit 130 may include one or more source driver integrated circuits (SDICs).

Each of the SDICs may include a shift register, a latch circuit, a digital-to-analog converter (DAC), an output buffer, and the like.

Each of the SDICs may be connected to a bonding pad of the display panel 110 by a TAB method or by a COG method, may directly mounted on the display panel 110, or in some cases, may be integrated with the display panel 110. In addition, each of the SDICs may be implemented using a COF structure. In this case, each of the SDICs may be mounted on a film connected to the display panel 110, and be electrically connected to the display panel 110 through lines on the film.

The controller 140 supplies a variety of control signals to the gate and data driver circuits 120 and 130 to control operations of the gate and data driver circuits 120 and 130.

The controller 140 may be mounted on a printed circuit board (PCB), a flexible printed circuit (FPC), or the like, and may be electrically connected to the gate and data driver circuits 120 and 130 via the PCB or the FPC.

The controller 140 controls the gate driver circuit 120 to output the scanning signal at points in time defined by frames. The controller 140 converts image data, received from an external source, into a data signal format readable by the data driver circuit 130, and outputs the converted image data to the data driver circuit 130.

The controller 140 receives a variety of timing signals, including a vertical synchronization signal Vsync, a horizontal synchronization signal Hsync, an input data enable (DE) signal, a clock (CLK) signal, and the like, in addition to the image data, from an external source (e.g., a host system).

The controller 140 may generate a variety of control signals using the variety of timing signals received from the external source, and output the control signals to the gate and data driver circuits 120 and 130.

For example, the controller 140 outputs a variety of gate control signals GCS, including a gate start pulse (GSP), a gate shift clock (GSC), a gate output enable (GOE) signal, and the like, to control the gate driver circuit 120.

Here, the GSP controls operation start times of the one or more GDICs of the gate circuit 120. The GSC is a clock signal that is commonly input to the one or more GDICs and controls a shift time of the scanning signal. The GOE signal designates timing information of the one or more GDICs.

In addition, the controller 140 outputs a variety of data control signals DCS, including a source start pulse (SSP), a source sampling clock (SSC), a source output enable (SOE) signal, and the like, to control the data driver circuit 130.

Here, the SSP controls data sampling start times of the one or more SDICs of the data driver circuit 130. The SSC is a clock signal that controls a sampling time of data in each of the SDICs. The SOE signal controls an output time of the data driver circuit 130.

The display device 100 may further include a power management integrated circuit (PMIC) that supplies various forms of voltage or current to the display panel 110, the gate driver circuit 120, the data driver circuit 130, and the like, or controls various types of voltage or current to be supplied thereto.

The subpixels SP are defined by intersections of the gate lines GL and the data lines DL. Liquid crystal or light-emitting diodes (LEDs) may be disposed in the subpixels SP, depending on the type of the display device 100.

Figure 2:
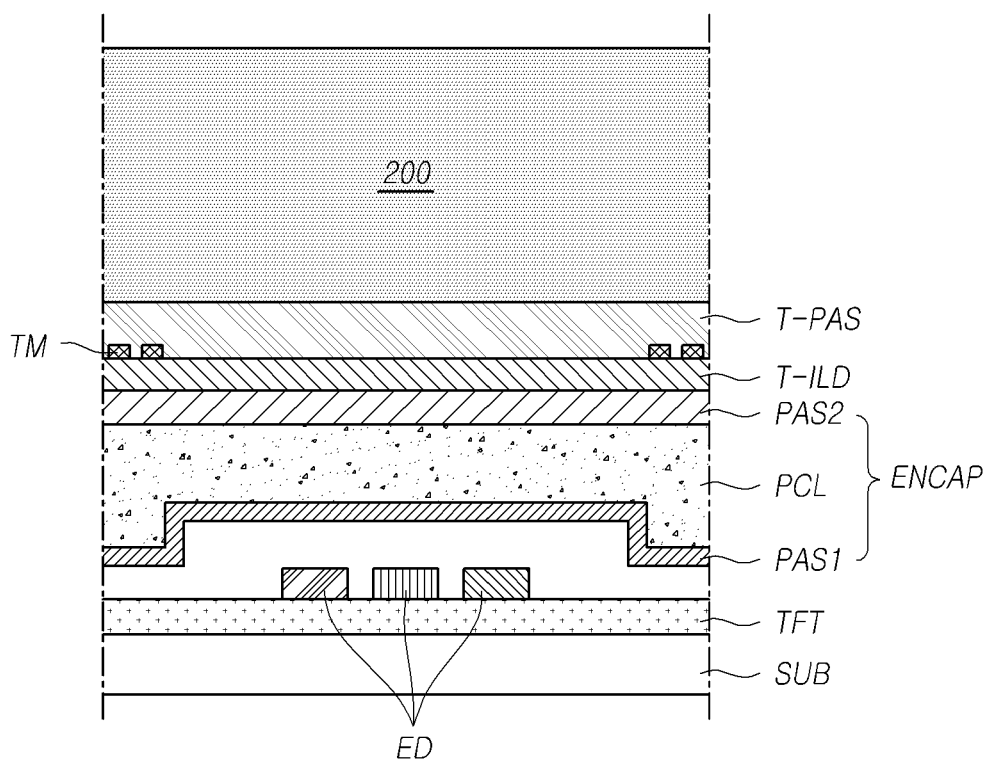
FIG. 2 illustrates a cross-sectional structure of a display panel according to exemplary embodiments of the present disclosure.

FIG. 2 illustrates a cross-sectional structure of a display panel 110 according to exemplary embodiments of the present disclosure.

Referring to FIG. 2, a thin film transistor layer TFT is disposed on a substrate SUB. A plurality of thin film transistors, signal lines, voltage lines for driving the sub-pixels SP may be disposed on the thin film transistor layer TFT. If necessary, at least one insulation layer may be disposed between the substrate SUB and the thin film transistor layer TFT.

Light-emitting diodes ED are disposed on the thin film transistor layer TFT, and the light-emitting diodes EDs may be organic light-emitting diodes. Each of the light-emitting diodes EDs includes an anode and a cathode, and may include a hole transport layer, an organic light-emitting layer, and an electron transport layer that are disposed between the anode and the cathode. Each of the light-emitting diodes ED may emit red, green, or blue light. Alternatively, each of the light-emitting diodes ED may emit white light, and be coated with a color change material.

Each of the light-emitting diodes ED may emit light in a forward direction of the substrate SUB. If necessary, each of the light-emitting diodes ED may emit light in a backward direction of the substrate SUB. FIG. 2 illustrates a case in which the display panel 110 emits light in the forward direction of the substrate SUB.

Electrodes or the like for driving the light-emitting diodes ED, an encapsulation layer ENCAP for protecting the light-emitting diodes ED, and the like, may be disposed on the light-emitting diodes ED.

The encapsulation layer ENCAP may have a plurality of layers, for example a first inorganic encapsulation layer PAS1, an organic encapsulation layer PCL, and a second inorganic encapsulation layer PAS2.

In a case in which the display panel 110 provides a touch perception function, touch metal TM may disposed on the encapsulation layer ENCAP.

For example, a touch insulation layer T-ILD may be disposed on the encapsulation layer ENCAP, and the touch metal TM constituting touch electrodes and touch lines may be disposed on the touch insulation layer T-ILD. A touch passivation layer T-PAS may be disposed on the touch metal TM.

A polarizer 200 may be disposed on the touch passivation layer T-PAS.

The polarizer 200 may be disposed on a surface through which images are displayed on the display panel 110. That is, in a case in which the display panel 110 has a bottom emission structure, the polarizer 200 may be disposed on the bottom of the substrate SUB.

The polarizer 200 reduces reflectance of light incident from the outside of the display panel 110, thereby preventing a failure in perception of the images displayed by the display panel 110 from being perceived due to reflection of external light.

In this manner, the reflectance of external light can be reduced by disposing the polarizer 200 on the display panel 110, but transmittance of light emerging from the display panel 110 can be reduced due to the polarizer 200.

Further, due to the disposition of the polarizer 200, a production cost of the display panel 110 can be increased.

Exemplary embodiments provide a technique capable of reducing reflectance of the display panel 110 and increasing transmittance of the display panel 110 without the polarizer 200 by disposing a pattern capable of reducing reflectance on one surface of the insulation layer included in the display panel 110.

Figure 3:
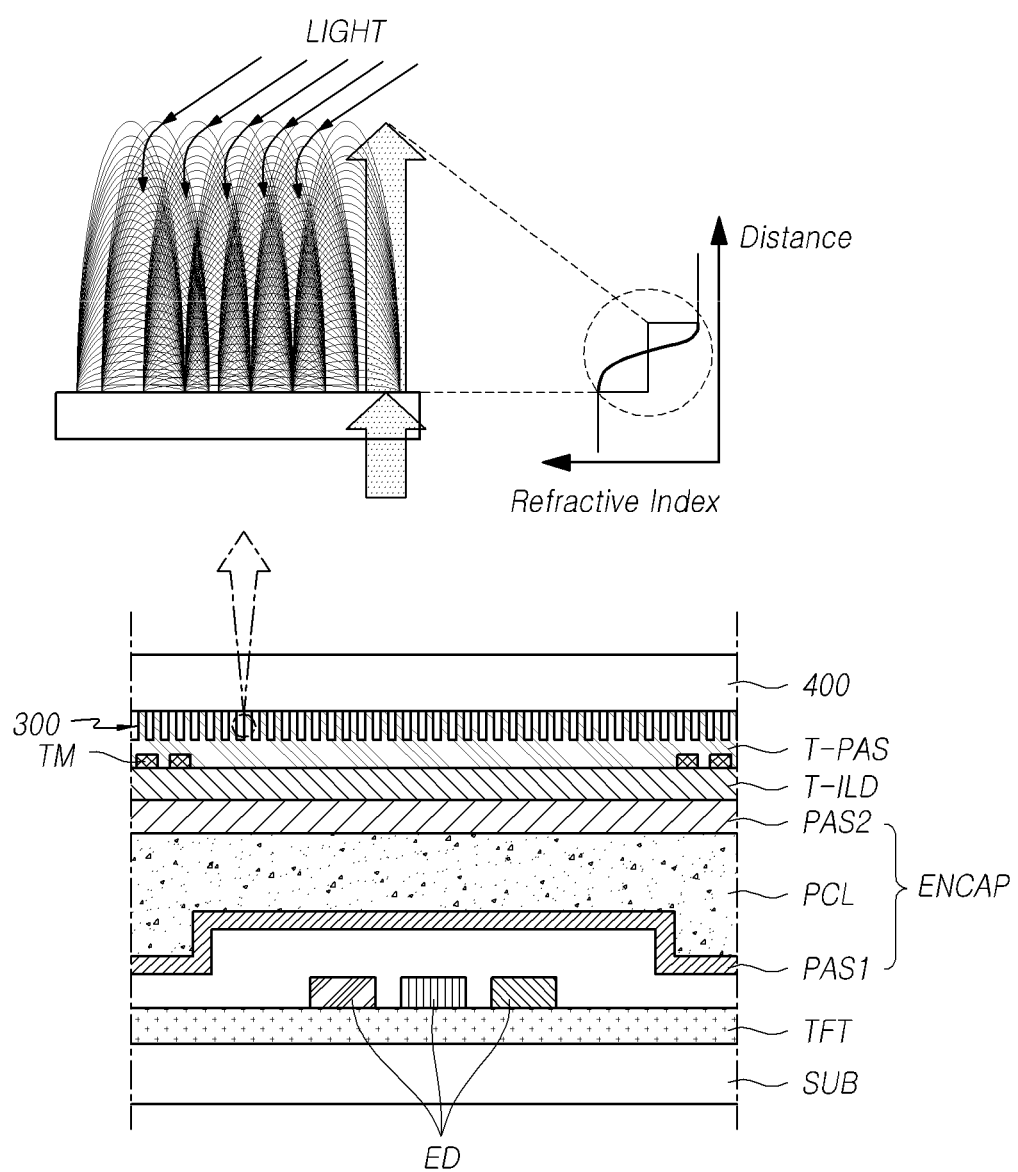
FIG. 3 illustrates a cross-sectional structure of a display panel having a moth-eye patterned layer according to exemplary embodiments.

FIG. 3 illustrates a cross-sectional structure of the display panel 110 having a moth-eye patterned layer 300 according to exemplary embodiments.

Referring to FIG. 3, a thin film transistor layer TFT is disposed on a substrate SUB, and light-emitting diodes ED are disposed on the thin film transistor layer TFT.

Here, at least one insulation layer may be disposed between the thin film transistor layer TFT and the light-emitting diodes ED. Herein, for the sake of brevity, insulation layers disposed under and below the light-emitting diodes ED may be referred to as "lower insulation layers."

An encapsulation layer ENCAP including a first inorganic encapsulation layer PAS1, an organic encapsulation layer PCL, and a second inorganic encapsulation layer PAS2 may be disposed on the light-emitting diodes ED.

A touch insulation layer T-ILD, touch metal TM, and a touch passivation layer T-PAS may be disposed on the encapsulation layer ENCAP.

The insulation layers disposed on and above the light-emitting diodes ED as described above may be referred to as "upper insulation layers."

Here, in a case in which the light-emitting diodes ED emit light in a forward direction of the substrate SUB, at least one of the upper insulation layers may include a nanoscaled moth-eye patterned layer 300 that is formed by patterning at least a portion of the area of one surface thereof.

The moth-eye patterned layer 300 may be disposed on an area corresponding to an area in which the light-emitting diodes ED are disposed, or on the entire active area A/A.

For example, as illustrated in FIG. 3, the nanoscaled moth-eye patterned layer 300 may be disposed on one surface of the touch passivation layer T-PAS that is an insulation layer disposed in the uppermost layer on the display panel 110.

Further, in a case in which a structure for touch sensing is not disposed on the display panel 110, the nanoscaled moth-eye patterned layer 300 may be disposed on one surface of the second inorganic encapsulation layer PAS2.

Further, the nanoscaled moth-eye patterned layer 300 may be disposed at an interface between two of the plurality of upper insulation layers disposed on and above the light-emitting diodes ED.

In this case, the nanoscaled moth-eye patterned layer 300 may be disposed on one surface of at least one of the organic and inorganic insulation layers at an interface between the organic and inorganic insulation layers among the upper insulation layers.

That is, the nanoscaled moth-eye patterned layer 300 may be disposed in the uppermost layer of the upper insulation layers disposed on a path along which the light emitted from the light-emitting diodes ED emerges, or one surface of at least one of the insulation layers disposed under and below the uppermost layer.

The moth-eye patterned layer 300 may be, for example, a pattern, such as a pattern of nanoscaled features, in which nanoscaled pyramidal shapes or shapes corresponding to a portion of a nanoscaled sphere are repetitively disposed.

As the nanoscaled features are repetitively disposed, a refractive index can be gradually continuously changed from the outside of the moth-eye patterned layer 300 to the inside of the moth-eye patterned layer 300.

Thus, a refractive index of light incident upon the display panel 110 from the outside of the display panel 110 can be approximated to 0% by the moth-eye patterned layer 300. Further, since a degree to which light emerged outward from the display panel 110 is diffused on a surface is reduced, transmittance can be increased.

In this manner, the nanoscaled moth-eye patterned layer 300 may be disposed on one surface of at least one insulation layer disposed on the path along which the light emitted from the light-emitting diodes ED on the display panel 110 emerges, so as to reduce reflectance of the light incident upon the display panel 110 from the outside of the display panel 110 and increase transmittance of the light emerging from the display panel 110.

An optical film 400 or the like may be disposed on the touch passivation layer T-PAS on which the nanoscaled moth-eye patterned layer 300 is disposed, so as to reduce reflectance of external light and simultaneously increase transmittance of the light emerging from the display panel 110 without disposing the polarizer 200.

The nanoscaled moth-eye patterned layer 300 may be patterned and disposed on one surface of the insulation layer included in the display panel 110, or a separate layer having the nanoscaled moth-eye patterned layer 300 may be disposed in the display panel 110.

Figure 4:
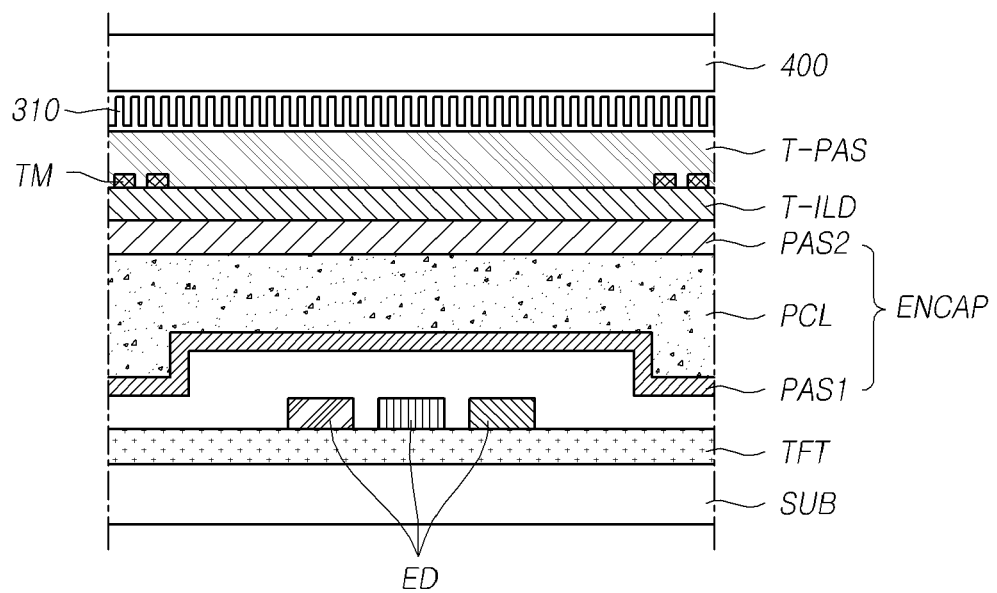
FIG. 4 illustrates another cross-sectional structure of the display panel having the moth-eye patterned layer according to exemplary embodiments.

FIG. 4 illustrates another cross-sectional structure of the display panel 110 having the moth-eye patterned layer 300 according to exemplary embodiments.

Referring to FIG. 4, a thin film transistor layer TFT and light-emitting diodes ED are disposed on a substrate SUB. An encapsulation layer ENCAP may be disposed on the light-emitting diodes ED. A touch insulation layer T-ILD, touch metal TM, and a touch passivation layer T-PAS may be disposed on and above the encapsulation layer ENCAP.

Here, an anti-reflection layer 310 including the nanoscaled moth-eye patterned layer 300 may be disposed on the touch passivation layer T-PAS.

An optical film 400 may be disposed on the anti-reflection layer 310.

That is, a separate layer on which the nanoscaled moth-eye patterned layer 300 is disposed may be disposed on the insulation layer included in the display panel 110 without forming the nanoscaled moth-eye patterned layer 300. Alternatively, a separate layer may be disposed, and the nanoscaled moth-eye patterned layer 300 may be formed on the separate layer.

In this manner, the anti-reflection layer 310 including the nanoscaled moth-eye patterned layer 300 may be disposed on a surface from which light emerges on the display panel 110, so as to increase transmittance of the light emerging from the display panel 110 while reducing reflectance of external light.

Figure 5:
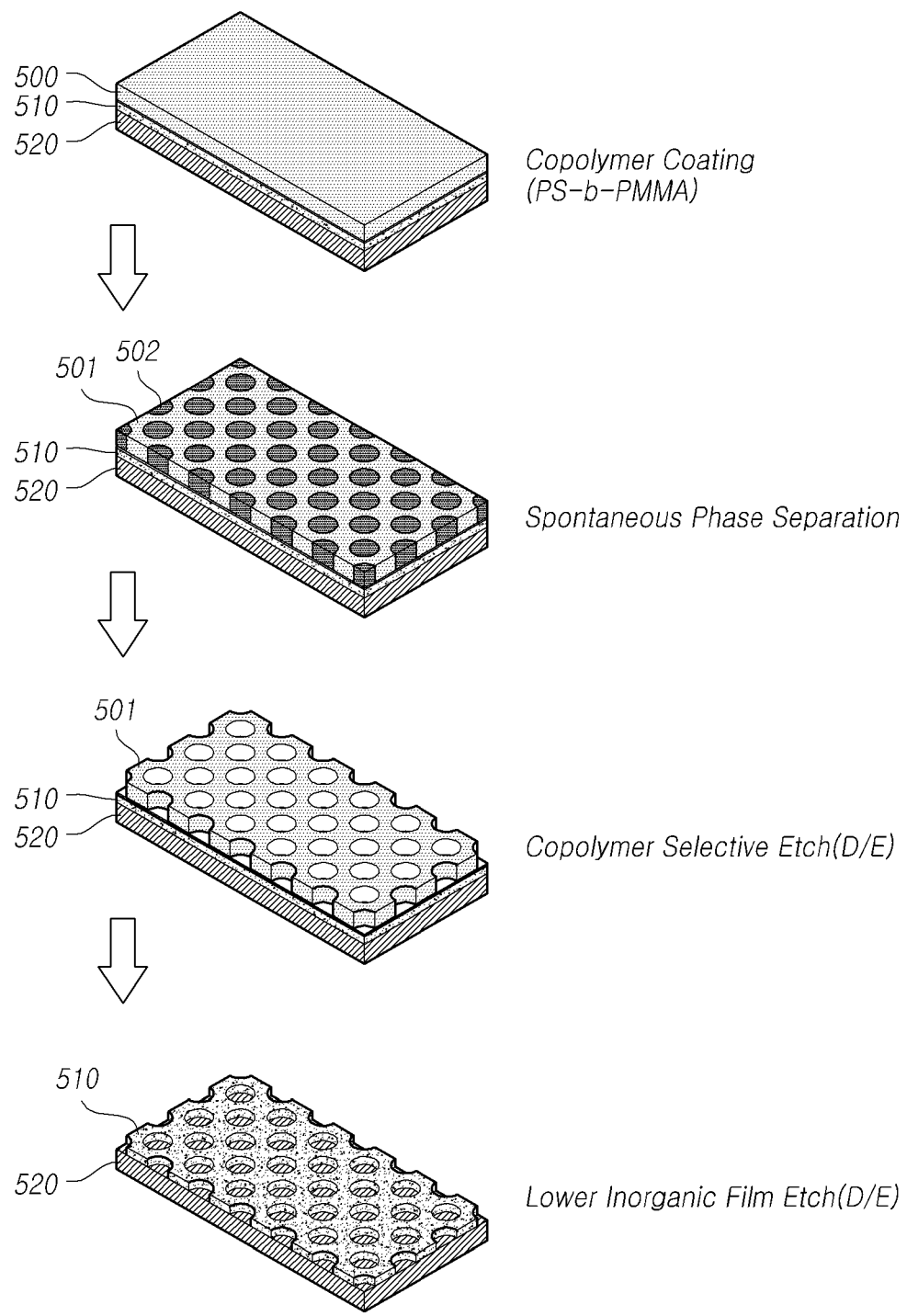

FIGS. 5 and 6 illustrate a method of disposing the moth-eye patterned layer 300 in the display panel 110 according to exemplary embodiments.

Referring to FIG. 5, an etching base 510 is disposed on a lower base 520, and a copolymer 500 is disposed on the etching base 510. Here, the copolymer 500 may be, for example, a block copolymer such as PS-b-PMMA.

This block copolymer 500 may be separated and disposed into polymers different from each other through spontaneous phase separation.

That is, the copolymer 500 may be separated and disposed into a first polymer 501 and a second polymer 502 through spontaneous phase separation.

In the state where the copolymer 500 is separated into the first polymer 501 and the second polymer 502 in this manner, the first polymer 501 or the second polymer 502 may be selectively etched to form a nanoscaled moth-eye patterned layer 300.

For example, the second polymer 502 of the copolymer 500 may be selectively etched to leave only the first polymer 501.

Further, the etching base 510 may be etched in the state in which only the first polymer 501 is left, such that the nanoscaled moth-eye patterned layer 300 can be formed on the etching base 510.

That is, the copolymer 500 is disposed on the insulation layer of the display panel 110, and is subjected to spontaneous phase separation and selective etching, so that the anti-reflection layer 310 including the nanoscaled moth-eye patterned layer 300 can be disposed.

Alternatively, the copolymer 500 is selectively etched, and then the insulation layer disposed under the copolymer 500 is selectively etched, so that the nanoscaled moth-eye patterned layer 300 can be formed on the insulation layer of the display panel 110.

If necessary, the nanoscaled moth-eye patterned layer 300 may be separately formed, and the insulation layer of the display panel 110 is etched using the nanoscaled moth-eye patterned layer 300 as a mask, so that the nanoscaled moth-eye patterned layer 300 can be formed on the insulation layer of the display panel 110.

Referring to FIG. 6, the nanoscaled moth-eye patterned layer 300 may be disposed using a nanoimprinting method.

For example, a master 600 including the nanoscaled moth-eye patterned layer 300 is produced, and then a replica 610 for forming the nanoscaled moth-eye patterned layer 300 can be produced using the master 600. Here, the replica 610 may be produced using, for example, a silicone polymer.

The replica 610 may be imprinted on a transfer base 620, so that the nanoscaled moth-eye patterned layer 300 can be formed on the transfer base 620.

That is, a material (e.g., a resin) corresponding to the transfer base 620 may disposed on the insulation layer of the display panel 110, and the replica 610 may be imprinted, so that the anti-reflection layer 310 including the nanoscaled moth-eye patterned layer 300 can be disposed on the insulation layer of the display panel 110.

If necessary, the replica 610 may be imprinted on the insulation layer of the display panel 110, so that the nanoscaled moth-eye patterned layer 300 can be formed on the insulation layer.

The aforementioned method has been described as an example of the method of forming the nanoscaled moth-eye patterned layer 300. Using various methods other than this method, the nanoscaled moth-eye patterned layer 300 may be formed on the insulation layer of the display panel 110, or the anti-reflection layer 310 including the nanoscaled moth-eye patterned layer 300 may be disposed on the insulation layer of the display panel 110.

In this manner, the nanoscaled moth-eye patterned layer 300 is disposed on the surface through which the image is displayed on the display panel 110, so that transmittance of light emerging from the display panel 110 can be increased while reducing reflectance of external light.

Further, a pattern for suppressing reflected light may be disposed on at least a portion of an area other than an area from which light emerges on a surface on which the display panel 110 displays the image.

Figure 7:
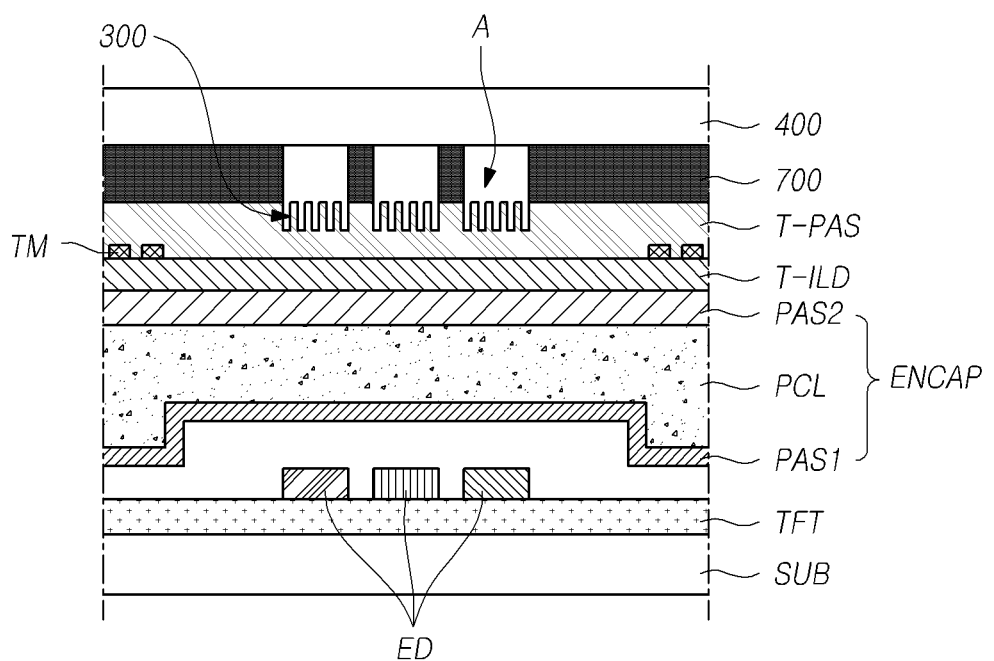
FIGS. 7 to 9 illustrate a cross-sectional structure in which an anti-reflector is disposed on the display panel having the moth-eye patterned layer according to exemplary embodiments.
Figure 8:
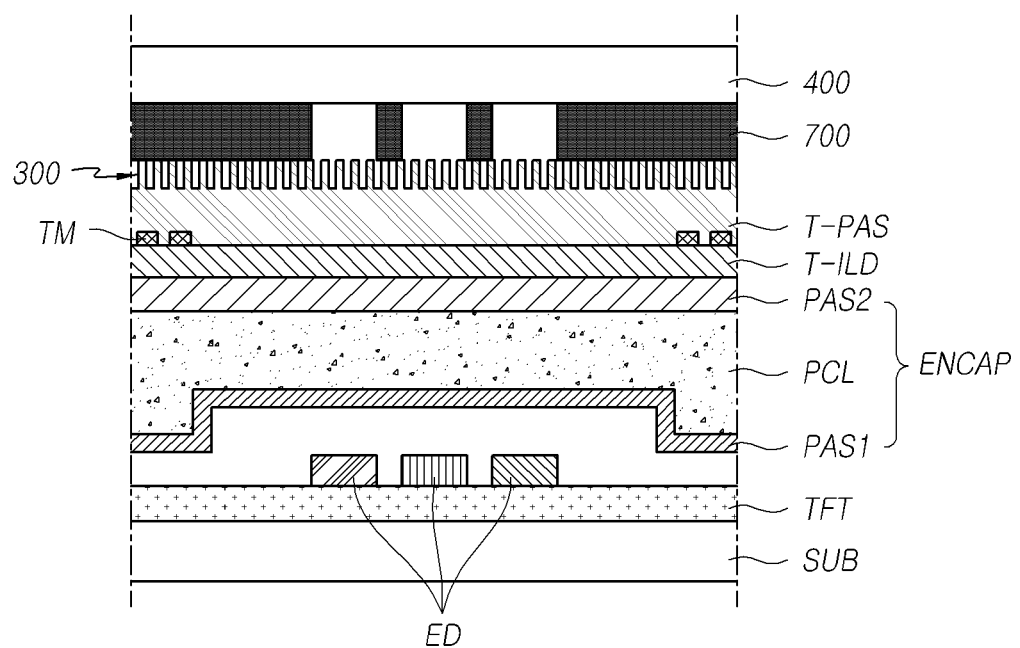
Figure 9:
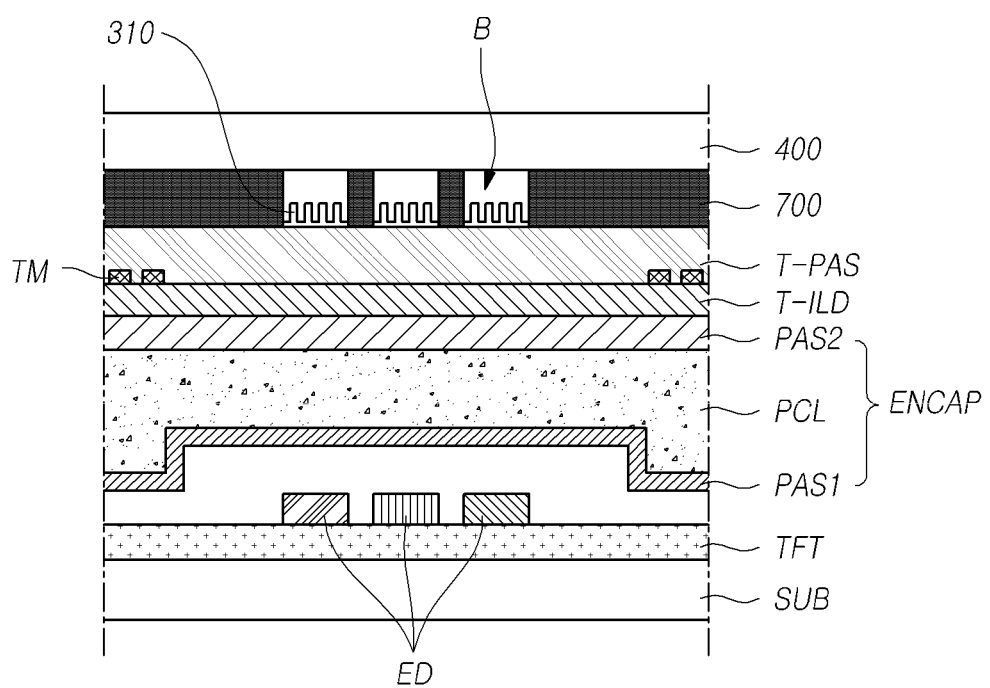

<SH>FIGS. 7 to 9 illustrate a cross-sectional structure in which an anti-reflector 700 is disposed on the display panel 110 having the moth-eye patterned layer 300 according to exemplary embodiments.

Referring to FIG. 7, a thin film transistor layer TFT and light-emitting diodes ED are disposed on a substrate SUB. An encapsulation layer ENCAP is disposed on the light-emitting diodes ED. A touch insulation layer T-ILD, touch metal TM, and a touch passivation layer T-PAS may be disposed on and above the encapsulation layer ENCAP.

Here, the anti-reflector 700 may be disposed on at least a portion of an area other than areas corresponding to areas on which the light-emitting diodes ED are disposed on the touch passivation layer T-PAS.

The anti-reflector 700 may be, for example, a black matrix, and may be disposed on a residual area other than the areas corresponding to the areas on which the light-emitting diodes ED are disposed.

That is, the anti-reflector 700 formed of a black matrix is disposed on an area other than areas from which light emerges on the display panel 110, so that external light incident upon the display panel 110 can be prevented from being reflected on the display panel 110.

In this case, although reflected light is suppressed by disposing the anti-reflector 700 in the display panel 110, the anti-reflector 700 cannot be disposed on the areas corresponding to the areas on which the light-emitting diodes ED are disposed, that is, the areas from which light emerges.

Thus, reflection of external light can be prevented by disposing a nanoscaled moth-eye patterned layer 300 on areas on which the anti-reflector 700 is not disposed at the insulation layer of the display panel 110.

For example, the nanoscaled moth-eye patterned layer 300 may be disposed on the areas on which the anti-reflector 700 is not disposed at the touch passivation layer T-PAS, that is, areas corresponding to open areas of the anti-reflector 700.

In this manner, the nanoscaled moth-eye patterned layer 300 may be disposed on the open areas of the anti-reflector 700, so that reflectance of external light can be reduced on the areas on which the anti-reflector 700 is not disposed.

An optical film 400 may be disposed on the anti-reflector 700.

Here, areas A between the optical film 400 and the nanoscaled moth-eye patterned layer 300 patterned on one surface of the touch passivation layer T-PAS may be air layers.

That is, the air layers having a refractive index different from that of the touch passivation layer T-PAS on which the nanoscaled moth-eye patterned layer 300 is patterned may be formed, so that reflection of light incident from the outside can be prevented.

Alternatively, a passivation layer (e.g., a resin) having a refractive index different from that of the touch passivation layer T-PAS may be disposed on the areas A. A material having a refractive index different from that of the nanoscaled moth-eye patterned layer 300 may be disposed, so that an anti-reflecting function can be provided.

For example, after the anti-reflector 700 is disposed on the touch passivation layer T-PAS, the nanoscaled moth-eye patterned layer 300 may be patterned on the touch passivation layer T-PAS through the open areas of the anti-reflector 700.

Alternatively, after the nanoscaled moth-eye patterned layer 300 is formed on the touch passivation layer T-PAS, the anti-reflector 700 may be disposed.

In this case, the nanoscaled moth-eye patterned layer 300 may be patterned throughout the touch passivation layer T-PAS.

Referring to FIG. 8, the nanoscaled moth-eye patterned layer 300 may be patterned throughout one surface of the touch passivation layer T-PAS.

If necessary, the nanoscaled moth-eye patterned layer 300 may be patterned throughout one surface of any one of the insulation layers disposed under or below the touch passivation layer T-PAS.

The anti-reflector 700 may be disposed on an area other than the areas corresponding to the areas on which the light-emitting diodes ED are disposed at the touch passivation layer T-PAS on which the nanoscaled moth-eye patterned layer 300 is patterned.

That is, the nanoscaled moth-eye patterned layer 300 may be disposed on the areas corresponding to the open areas of the anti-reflector 700 as well as an area under the area on which the anti-reflector 700 is disposed.

In this manner, after the nanoscaled moth-eye patterned layer 300 is patterned throughout the touch passivation layer T-PAS, the anti-reflector 700 may be disposed, so that the process of forming the nanoscaled moth-eye patterned layer 300 can be easily performed.

Further, the nanoscaled moth-eye patterned layer 300 may be disposed on the touch passivation layer T-PAS, so as to reduce reflectance of external light, suppress reflected light through the disposition of the anti-reflector 700, and prevent reflection of external light on the area on which the anti-reflector 700 cannot be disposed.

In a structure in which the anti-reflector 700 is disposed, an anti-reflection layer 310 including the nanoscaled moth-eye patterned layer 300 may be disposed on the open areas of the anti-reflector 700.

Referring to FIG. 9, the anti-reflector 700 may be disposed on the areas corresponding to the areas on which the light-emitting diodes ED are disposed at the touch passivation layer T-PAS.

The anti-reflection layer 310 including the nanoscaled moth-eye patterned layer 300 may be disposed on the open areas of the anti-reflector 700.

Here, air layers may be present in areas B between the optical film 400 disposed on the anti-reflector 700 and the anti-reflection layer 310, and a passivation layer having a refractive index different from that of the anti-reflection layer 310 may be disposed on the areas B.

In this manner, in a structure in which the anti-reflector 700 for suppressing reflected light is disposed on the area other than the area from which light emerges on the display panel 110, the anti-reflection layer 310 including the nanoscaled moth-eye patterned layer 300 is disposed on the open areas of the anti-reflector 700, so that reflection of external light on the area from which light emerges on the display panel 110.

Figure 10:
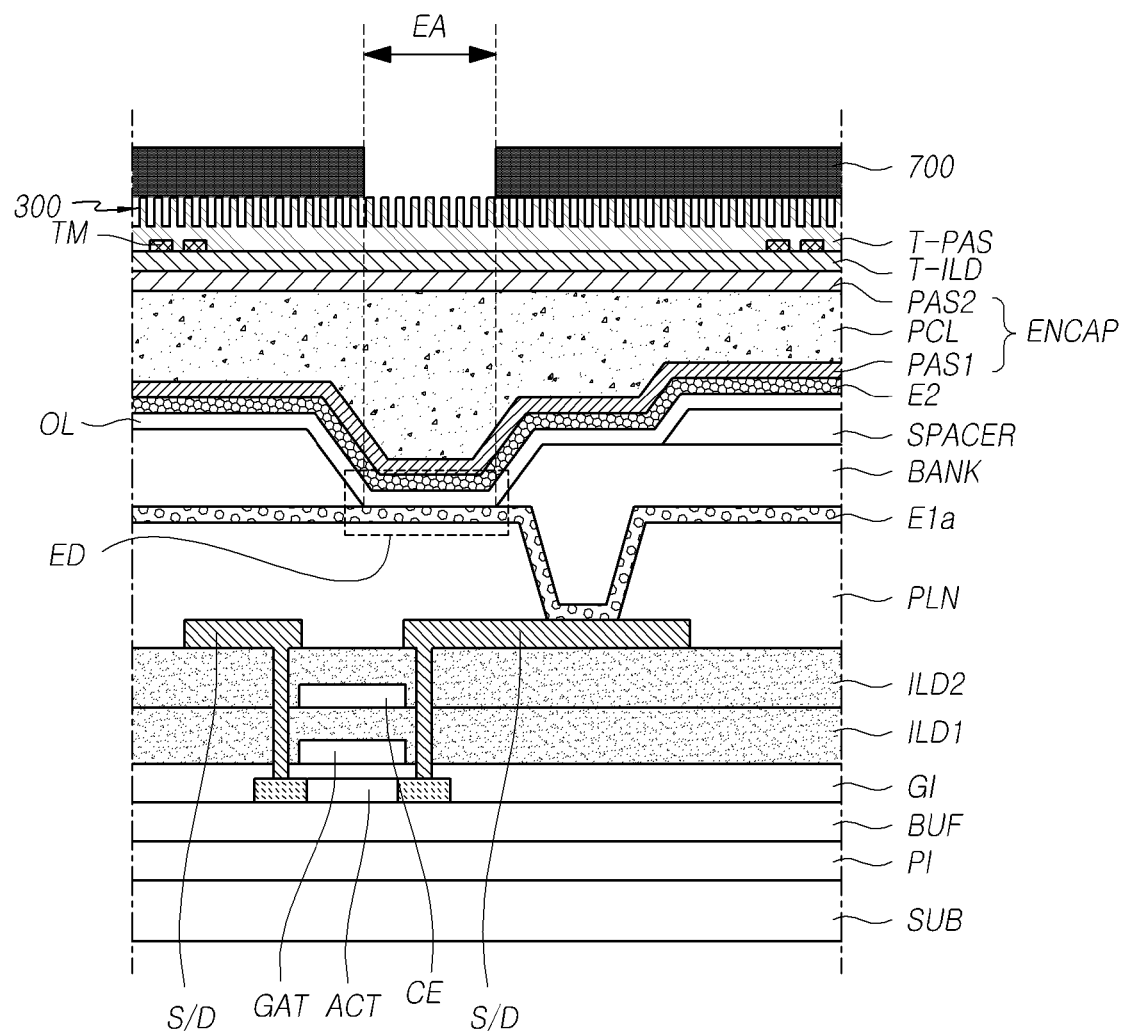
FIGS. 10 and 11 illustrate a cross-sectional structure including the moth-eye patterned layer in a case in which the display panel according to exemplary embodiments has a top emission structure.
Figure 11:
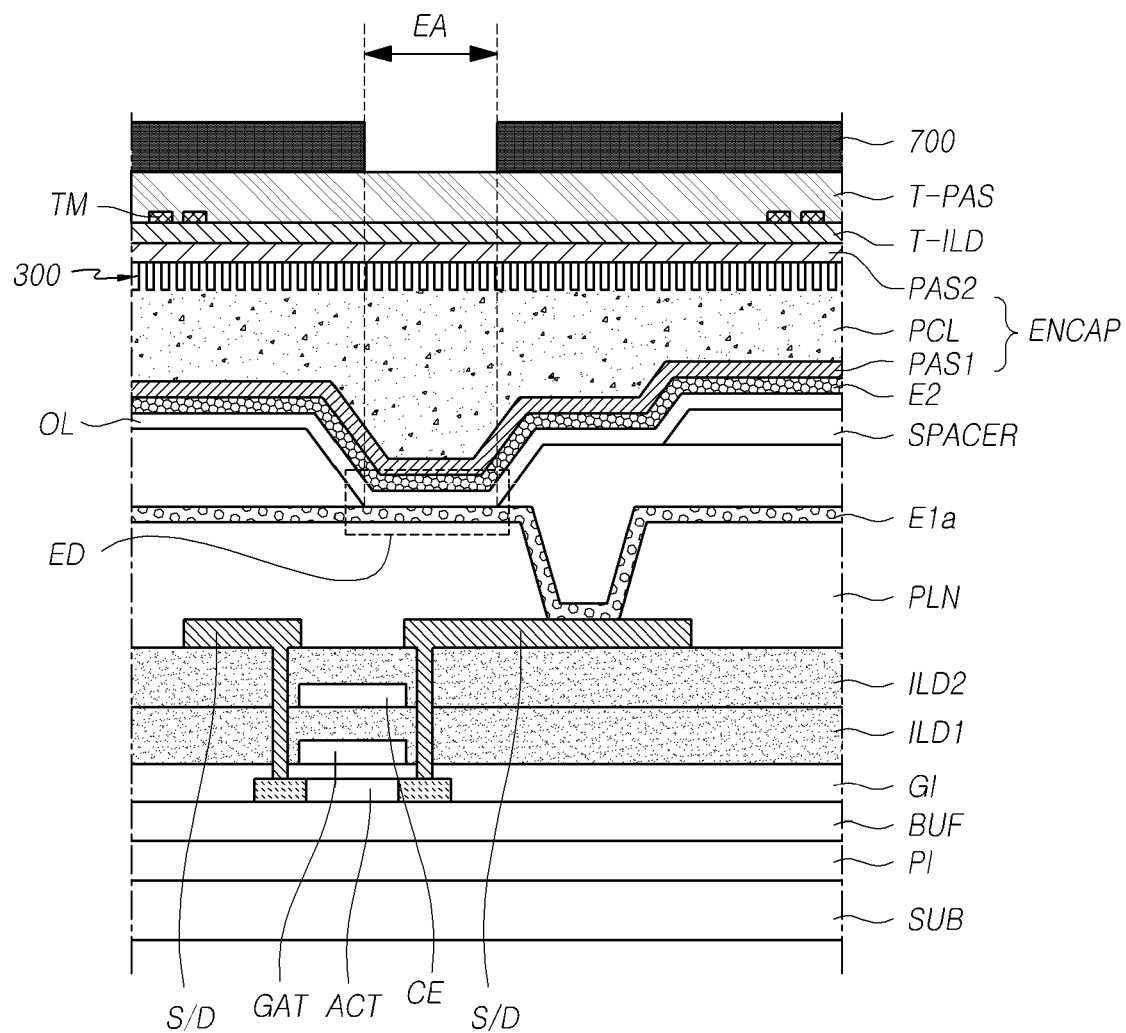

FIGS. 10 and 11 illustrate a specific cross-sectional structure including the moth-eye patterned layer 300 in a case in which the display panel 110 according to exemplary embodiments has a top emission structure.

Referring to FIG. 10, a polyimide layer PI is disposed on a substrate SUB. The polyimide layer PI may be formed of an organic material.

A buffer layer BUF is disposed on the polyimide layer PI, and an active layer ACT is disposed on the buffer layer BUF. A gate insulation layer GI is disposed on the active layer ACT, and a gate electrode GAT is disposed on the gate insulation layer GI.

A first interlayer insulation layer ILD1 may be disposed on the gate insulation layer GI, and a capacitor electrode CE may be disposed on the first interlayer insulation layer ILD1. A second interlayer insulation layer ILD2 may be disposed on the capacitor electrode CE, and source/drain electrodes S/D may be disposed on the second interlayer insulation layer ILD2.

Here, each of the buffer layer BUF, the gate insulation layer GI, the first interlayer insulation layer ILD1, and the second interlayer insulation layer ILD2 may be formed of an inorganic material.

A planarization layer PLN is disposed on the source/drain electrodes S/D, and a first electrode E1a is disposed on the planarization layer PLN. The first electrode E1a may be an anode for the light-emitting diodes ED. The first electrode E1a may be made up of, for example, a reflection layer formed of an alloy containing silver and a layer formed of a transparent conductive oxide (TCO) based on an indium tin oxide (ITO).

A bank layer BANK may be disposed on the first electrode E1a, and an organic layer OL may be disposed on the bank layer BANK and the first electrode E1a on which the bank layer BANK is not disposed. The organic layer OL may include a hole transport layer, and a light-emitting layer, and an electron transport layer. Here, the light-emitting layer may emit, for example, red, green, or blue light. In this case, the light-emitting layer may be formed on a subpixel area including a light-emitting area EA. Alternatively, the light-emitting layer may emit white light. In this case, the light-emitting layer may be extended to and disposed on the areas other than the areas on which the light-emitting diodes ED are disposed. A spacer SPACER may be partly disposed on the bank layer BANK.

Here, each of the planarization layer PLN and the bank layer BANK may be formed of an organic material.

A second electrode E2 may be disposed on the bank layer BANK, and the second electrode E2 may be a cathode of the light-emitting diodes ED.

A first inorganic encapsulation layer PAS1, an organic encapsulation layer PCL, and a second inorganic encapsulation layer PAS2 may be disposed on the second electrode E2.

In the case of the display panel 110 in which touch perception is possible, a touch insulation layer T-ILD may be disposed on the second inorganic encapsulation layer PAS2, and touch metal TM and a touch passivation layer T-PAS may be disposed on the touch insulation layer T-ILD.

Each of the touch insulation layer T-ILD and the touch passivation layer T-PAS may be formed of an inorganic material. If necessary, at least one of the touch insulation layer T-ILD and the touch passivation layer T-PAS may be formed of an organic material.

Here, a nanoscaled moth-eye patterned layer 300 may be disposed on one surface of the touch passivation layer T-PAS disposed in the uppermost layer of the display panel 110. The nanoscaled moth-eye patterned layer 300 may be disposed only on the area on which each of the light-emitting diodes ED is disposed, that is, an area corresponding to the light-emitting area EA, and be disposed on an entire area as illustrated in FIG. 11.

An anti-reflector 700 may be disposed on the touch passivation layer T-PAS on which the nanoscaled moth-eye patterned layer 300 is patterned.

The anti-reflector 700 may be disposed on an area other than the area corresponding to the area on which each of the light-emitting diodes ED is disposed on the touch passivation layer T-PAS.

Thus, reflection of external light can be prevented by the anti-reflector 700, and by the nanoscaled moth-eye patterned layer 300 patterned on the touch passivation layer T-PAS on an open area of the anti-reflector 700.

Further, the anti-reflector 700 may be disposed after the nanoscaled moth-eye patterned layer 300 is patterned throughout the touch passivation layer T-PAS, so that a structure for suppressing reflection of external light can be easily formed in the display panel 110.

If necessary, the nanoscaled moth-eye patterned layer 300 may be patterned on one surface of at least one of the insulation layers disposed under and below the uppermost layer.

For example, as illustrated in FIG. 11, the nanoscaled moth-eye patterned layer 300 may be patterned and disposed at an interface between the organic encapsulation layer PCL formed of an organic material and the second inorganic encapsulation layer PAS2 formed of an inorganic material at the encapsulation layer ENCAP disposed on the second electrode E2.

That is, after the organic encapsulation layer PCL is disposed on the first inorganic encapsulation layer PAS1, the nanoscaled moth-eye patterned layer 300 may be patterned on at least a portion of the top surface of the organic encapsulation layer PCL.

A second inorganic encapsulation layer PAS2 may be disposed on the organic encapsulation layer PCL on which the nanoscaled moth-eye patterned layer 300 is patterned.

In this case, even if the second inorganic encapsulation layer PAS2 is disposed on the nanoscaled moth-eye patterned layer 300 patterned on the organic encapsulation layer PCL, refractive indices of the organic encapsulation layer PCL and the second inorganic encapsulation layer PAS2 are different, and thus the nanoscaled moth-eye patterned layer 300 patterned on the organic encapsulation layer PCL can prevent reflection of external light.

That is, the nanoscaled moth-eye patterned layer 300 may be patterned on the insulation layer disposed under the uppermost layer among the insulation layers included in the display panel 110 if necessary. In this case, the moth-eye patterned layer may be disposed at an interface between the organic insulation layer and the inorganic insulation layer, so that an anti-reflecting function can be provided through the moth-eye patterned layer.

Further, the structure in which the nanoscaled moth-eye patterned layer 300 is patterned on the insulation layer can also be applied to the case in which the display panel 110 is the bottom emission structure.

Figure 12:
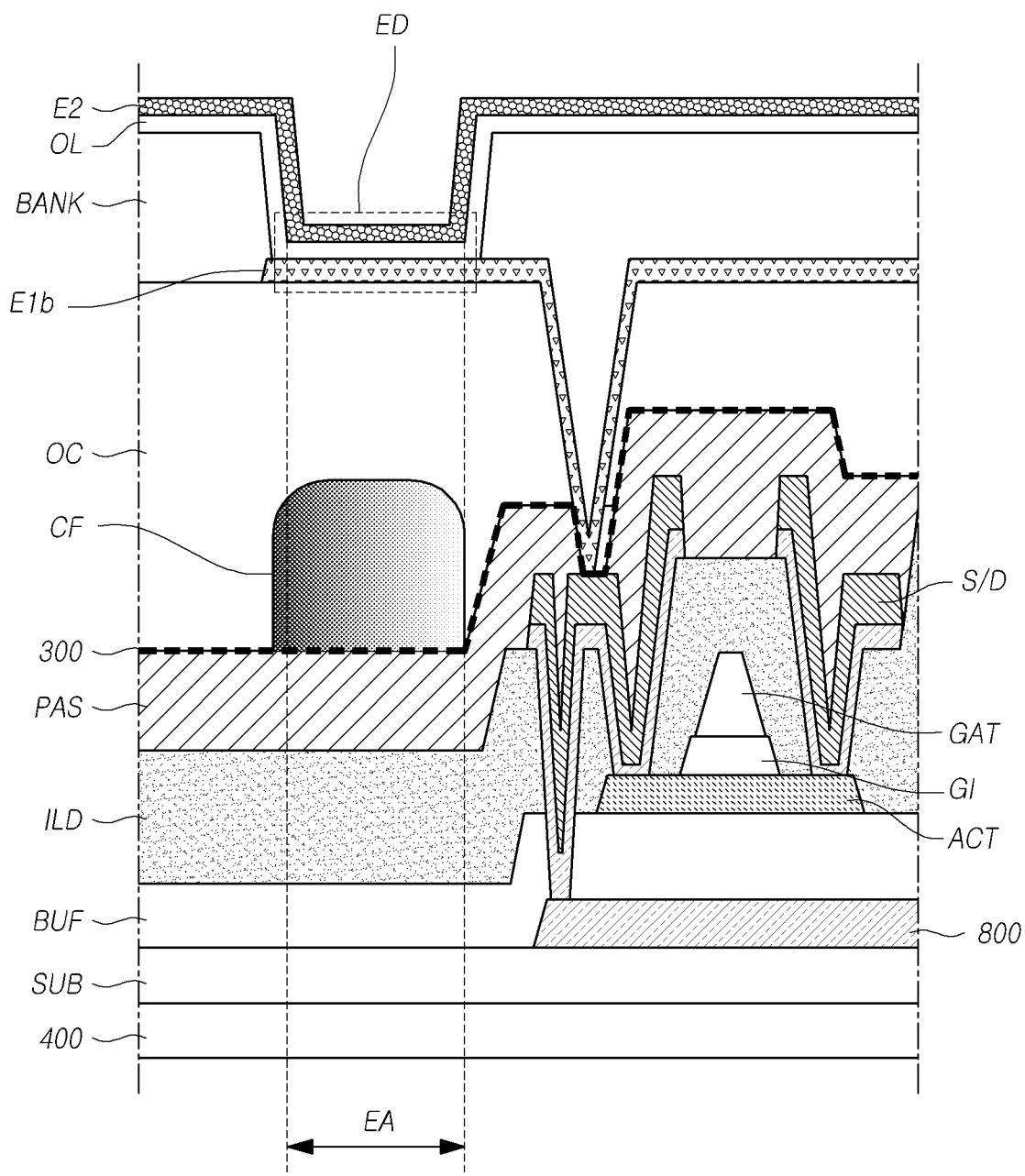
FIGS. 12 and 13 illustrate a cross-sectional structure including the moth-eye patterned layer in a case in which the display panel according to exemplary embodiments has a bottom emission structure.
Figure 13:
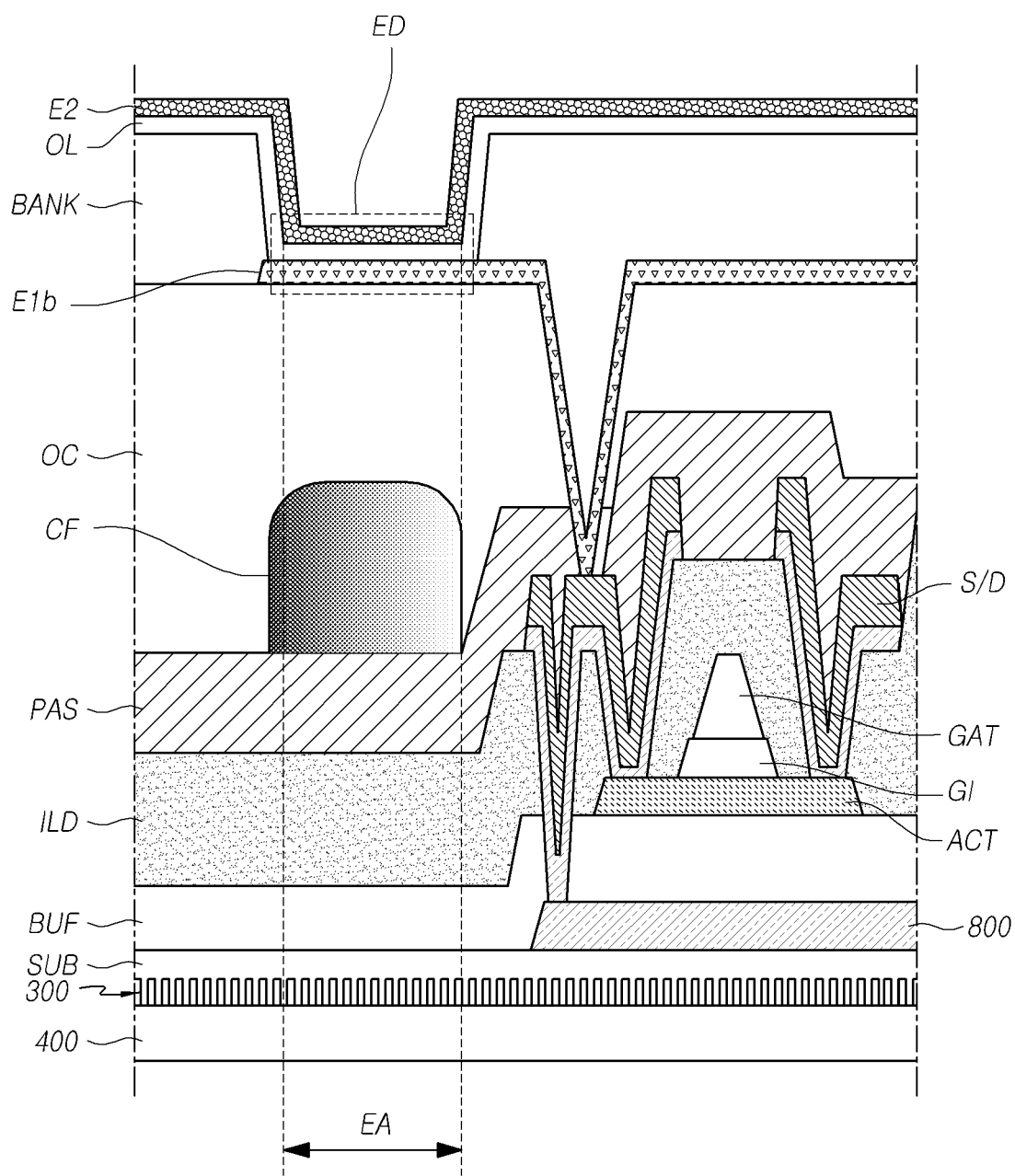

FIGS. 12 and 13 illustrate a specific cross-sectional structure including the moth-eye patterned layer 300 in the case in which the display panel 110 according to exemplary embodiments has the bottom emission structure.

Referring to FIG. 12, a buffer layer BUF is disposed on a substrate SUB, and an active layer ACT is disposed on the buffer layer BUF. Here, the substrate SUB may be a transparent glass substrate.

The buffer layer BUF may be formed of an inorganic material. For the sake of brevity, insulation layers disposed under and below a thin film transistor may be referred to as "first lower insulation layers."

A gate insulation layer GI and a gate electrode GAT may be disposed on the active layer ACT, and an interlayer insulation layer ILD may be disposed on the gate electrode GAT. Source/drain electrodes S/D may be disposed on the interlayer insulation layer ILD, and a thin-film-transistor passivation layer PAS may be disposed on the source/drain electrodes S/D.

Here, each of the gate insulation layer GI, the interlayer insulation layer ILD, and the thin-film-transistor passivation layer PAS may be formed of an inorganic material.

A color filter CF and an overcoat layer OC are disposed on the thin-film-transistor passivation layer PAS, and a first electrode E1b is disposed on the overcoat layer OC. The first electrode E1b may be formed of, for example, TCO based on ITO. A bank layer BANK may be disposed on the first electrode E1b, and an organic layer OL including a hole transport layer, a light-emitting layer, and an electron transport layer may be disposed on the bank layer BANK and the first electrode E1*b* on which the bank layer BANK is not disposed. A second electrode E2 may be disposed on the organic layer OL and the bank layer BANK. In the illustration of FIG. 12, a structure in which the organic layer OL including a light-emitting layer emitting white light and the color filter CF is shown, and the organic layer OL may be extended to and disposed on an area other than an area on which each light-emitting diode ED is disposed.

Here, each of the color filter CF, the overcoat layer OC, and the bank layer BANK may be formed of an organic material.

For the sake of brevity, an insulation layer disposed between the light-emitting diode ED and the thin film transistor may be referred to as a "second lower insulation layer."

The light-emitting diode ED may emit white light, and the light emitted from the light-emitting diode ED may emerge to the back of the substrate SUB through the color filter CF. An optical film 400 may be disposed on the back of the substrate SUB.

That is, the first and second lower insulation layers disposed between the substrate SUB and the light-emitting diode ED are located on a path along which light emitted from the light-emitting diode ED emerges.

Thus, the nanoscaled moth-eye patterned layer 300 may be patterned on one surface of at least one of the first and second lower insulation layers, so as to provide an anti-reflecting function of external light.

In this case, the nanoscaled moth-eye patterned layer 300 may be disposed at an interface between an organic insulation layer and an inorganic insulation layer at the first and second lower insulation layers.

For example, as illustrated in FIG. 12, the nanoscaled moth-eye patterned layer 300 may be patterned and disposed at an interface between the thin-film-transistor passivation layer PAS formed of an inorganic material and the color filter CF formed of an organic material and between the thin-film-transistor passivation layer PAS and the overcoat layer OC.

That is, the nanoscaled moth-eye patterned layer 300 may be patterned on the top surface of the thin-film-transistor passivation layer PAS, and then the color filter CF and the overcoat layer OC may be disposed.

The nanoscaled moth-eye patterned layer 300 may be patterned only on the area corresponding to the area on which the light-emitting diode ED is disposed, that is, only on the light-emitting area EA, or be patterned throughout the top surface of the thin-film-transistor passivation layer PAS.

If necessary, an anti-reflection layer including the nanoscaled moth-eye patterned layer 300 may be disposed between the thin-film-transistor passivation layer PAS and the color filter CF and between the color filter CF and the overcoat layer OC.

In a case in which a plurality of first lower insulation layers are disposed under and below the thin film transistor, the nanoscaled moth-eye patterned layer 300 may be patterned and disposed on one surface of at least one of the plurality of first lower insulation layers.

An anti-reflecting function of external light can be provided through the nanoscaled moth-eye patterned layer 300 disposed between the substrate SUB and the light-emitting diode ED in this manner.

Here, a low reflection patterned layer 800 may be disposed below the thin film transistor.

The low reflection patterned layer 800 may be formed of, for example, Cu, IGZO, or Mo, be disposed below the thin film transistor, and be disposed between the substrate SUB and the buffer layer BUF.

The thin film transistor can be protected from external light by the low reflection patterned layer 800, and the anti-reflecting function of external light can be provided.

That is, reflection of external light incident upon an area other than the area corresponding to the area on which the light-emitting diode ED is disposed can be prevented by the low reflection patterned layer 800, and reflection of external light incident upon an area from which light emitted from the light-emitting diode ED emerges can be prevented by the nanoscaled moth-eye patterned layer 300 patterned on the insulation layer.

In this manner, due to the disposition of the nanoscaled moth-eye patterned layer 300 and the low reflection patterned layer 800, it is possible to prevent reflection of external light and increase transmittance on the display panel 110 having a bottom emission structure.

Further, the aforementioned nanoscaled moth-eye patterned layer 300 may be patterned on one surface of the substrate SUB.

For example, referring to FIG. 13, the nanoscaled moth-eye patterned layer 300 may be patterned and disposed on the back of the substrate SUB of the display panel 110. If necessary, the nanoscaled moth-eye patterned layer 300 may be disposed on the top surface of the substrate SUB.

An optical film 400 may be disposed under the substrate SUB on which the nanoscaled moth-eye patterned layer 300 is patterned.

Thus, an air layer may be present between the nanoscaled moth-eye patterned layer 300 and the optical film 400 disposed on the back of the substrate SUB.

Since a refractive index is gradually continuously changed from the outside to the inside of the nanoscaled moth-eye patterned layer 300, reflectance can be reduced by the nanoscaled moth-eye patterned layer 300.

In this manner, the nanoscaled moth-eye patterned layer 300 is patterned on one surface of the substrate SUB, so that reflection of light incident from the outside of the display panel 110 having the bottom emission structure can be prevented.

As set forth above, according to exemplary embodiments, the nanoscaled moth-eye patterned layer 300 is patterned and disposed on one surface of at least one of the insulation layers disposed on the path along which the light emitted from the light-emitting diode ED emerges on the display panel 110, so that reflection of external light can be suppressed and transmittance of light emerging to the outside can be increased.

Further, reflected light can be suppressed by disposing the anti-reflector 700 or the low reflection patterned layer 800 on at least a portion of the area other than the area corresponding to the area on which the light-emitting diode ED is disposed, and an anti-reflecting function of external light can be improved by disposing the nanoscaled moth-eye patterned layer 300 on the light-emitting area EA on which the anti-reflector 700 or the like cannot be disposed.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel, comprising:
    a substrate;
    at least one lower insulation layer disposed on the substrate;
    a plurality of light-emitting diodes disposed on the at least one lower insulation layer; and
    at least one upper insulation layer disposed on the plurality of light-emitting diodes,
    wherein the at least one lower insulation layer or the at least one upper insulation layer is located on a path along which light emitted from the plurality of light-emitting diodes emerges, the at least one lower insulation layer or the at least one upper insulation layer includes a nanoscaled moth-eye patterned layer patterned on at least a portion of one surface thereof, and the nanoscaled moth-eye patterned layer is patterned on areas corresponding to areas on which the light-emitting diodes are disposed, and
    wherein the nanoscaled moth-eye patterned layer is patterned on at least one surface of an organic insulation layer and an inorganic insulation layer at an interface between the organic insulation layer and the inorganic insulation layer.

2. The display panel according to claim 1, wherein the moth-eye patterned layer is patterned throughout an active area.

3. The display panel according to claim 1, wherein the moth-eye patterned layer is patterned on one surface of an uppermost one of the at least one upper insulation layer or the at least one lower insulation layer.

4. The display panel according to claim 1, wherein:
    the at least one upper insulation layer includes a first inorganic encapsulation layer, an organic encapsulation layer, and a second inorganic encapsulation layer laminated sequentially; and
    the moth-eye patterned layer is patterned on a top surface of the organic encapsulation layer.

5. The display panel according to claim 1, further comprising an anti-reflector that is disposed on the at least one upper insulation layer and is disposed on at least a portion of an area other than the areas corresponding to the areas on which the light-emitting diodes are disposed.

6. The display panel according to claim 5, wherein the moth-eye patterned layer is disposed on areas corresponding to open areas of the anti-reflector.

7. The display panel according to claim 6, wherein the moth-eye patterned layer is further disposed under an area on which the anti-reflector is disposed.

8. A display panel, comprising:
    a substrate;
    a plurality of light-emitting diodes disposed on the substrate;
    at least one insulation layer disposed on the plurality of light-emitting diodes;
    an anti-reflector disposed on a top surface of an outmost insulation layer of the at least one insulation layer on at least a portion of an area other than areas on which the light-emitting diodes are disposed, and including a plurality of open areas corresponding to the areas on which the light-emitting diodes are disposed; and
    an anti-reflection layer disposed on an area overlapping the plurality of open areas of the anti-reflector and including a nanoscaled moth-eye patterned layer.

9. The display panel according to claim 8, further comprising a passivation layer disposed on the anti-reflection layer on the open areas of the anti-reflector and having a refractive index different from that of the anti-reflection layer.

10. The display panel according to claim 8, further comprising an optical film disposed on the anti-reflector,
    wherein an air layer is present between the anti-reflection layer and the optical film.

11. The display panel according to claim 8, wherein electron transport layers included in the light-emitting diodes are extended to and disposed on an area other than the areas on which the light-emitting diodes are disposed.

12. A display panel, comprising:
    a transparent substrate;
    at least one first lower insulation layer disposed on the transparent substrate;
    a plurality of thin film transistors disposed on the at least one first lower insulation layer;
    at least one second lower insulation layer disposed on the plurality of thin film transistors;
    a plurality of light-emitting diodes disposed on the at least one second lower insulation layer; and
    a nanoscaled moth-eye patterned layer on at least a portion of one surface of at least one of the transparent substrate, the at least one first lower insulation layer, or the at least one second lower insulation layer, the nanoscaled moth-eye patterned layer being located between the plurality of light-emitting diodes and a lower surface of the transparent substrate.

13. The display panel according to claim 12, wherein the moth-eye patterned layer is on at least one surface of organic and inorganic insulation layers at an interface between the organic and inorganic insulation layers.

14. The display panel according to claim 12, wherein the moth-eye patterned layer is on the lower surface of the transparent substrate.

15. The display panel according to claim 12, wherein the moth-eye patterned layer is located under a color filter disposed below the plurality of light-emitting diodes.

16. The display panel according to claim 12, further comprising at least one low reflection patterned layer disposed below the plurality of thin film transistors.

17. The display panel according to claim 16, wherein the low reflection patterned layer is disposed on an upper surface of the transparent substrate.

18. The display panel according to claim 12, wherein the plurality of light-emitting diodes include light-emitting layers, the light-emitting layers extended to and disposed on an area other than areas on which the plurality of light-emitting diodes are disposed.

19. The display panel according to claim 12, wherein the transparent substrate comprises a transparent glass substrate.

* * * * *